US006971082B2

(12) United States Patent
Shiratori

(10) Patent No.: US 6,971,082 B2
(45) Date of Patent: Nov. 29, 2005

(54) METHOD AND APPARATUS FOR REVISING WIRING OF A CIRCUIT TO PREVENT ELECTRO-MIGRATION

(75) Inventor: Yuko Shiratori, Tokyo (JP)

(73) Assignee: NEC Corporation, Tokyo (JP)

( * ) Notice: Subject to any disclaimer, the term of this patent is extended or adjusted under 35 U.S.C. 154(b) by 571 days.

(21) Appl. No.: 10/043,312

(22) Filed: Jan. 14, 2002

(65) Prior Publication Data

US 2002/0095643 A1 Jul. 18, 2002

(30) Foreign Application Priority Data

Jan. 17, 2001 (JP) ............................ 2001-009075

(51) Int. Cl.[7] .......................... G06F 17/50; G06F 9/45
(52) U.S. Cl. ............................................ 716/13; 716/5
(58) Field of Search ............................... 716/1–2, 4–5, 716/8–14

(56) References Cited

U.S. PATENT DOCUMENTS 5,379,231 A * 1/1995 Pillage et al. ................. 703/14
5,581,475 A * 12/1996 Majors ........................ 716/10
5,737,580 A * 4/1998 Hathaway et al. ............ 716/12
6,247,162 B1 * 6/2001 Fujine et al. .................. 716/2
6,308,310 B1 * 10/2001 Nakamura .................. 716/14
6,405,354 B1 * 6/2002 Itazu et al. .................... 716/8
6,675,139 B1 * 1/2004 Jetton et al. .................. 703/17

FOREIGN PATENT DOCUMENTS

JP 10-150107 6/1998
JP 11-97541 4/1999

OTHER PUBLICATIONS

Japanese Office Action dated Mar. 11, 2003, with partial English translation.

* cited by examiner

*Primary Examiner*—Leigh M. Garbowski
(74) *Attorney, Agent, or Firm*—McGinn IP Law Group, PLLC

(57) ABSTRACT

A wiring designing method for electrically connecting a plurality of functional blocks on a semiconductor integrated circuit is disclosed, that comprises the steps of (a) obtaining a wiring branch point among the plurality of functional blocks, (b) obtaining a current density of the obtained wiring branch point, (c) determining whether or not the obtained current density exceeds a predetermined limit value, and (d) performing a process for decreasing a current density of a predetermined wiring portion that ends at the wiring branch portion whose current density exceeds the limit value corresponding to the determined result at the determining step (c).

21 Claims, 6 Drawing Sheets

FIG.4

| WIRING PORTION | WIRING RESISTANCE [Ω]/CURRENT VALUE[A] |
|---|---|
| BETWEEN SOURCE OUTPUT TERMINAL (A) – WIRING CONNECTION POINT (B) | Rw1 = 30.0 / Iw1 = 10.0 |
| BETWEEN WIRING CONNECTION POINT (B) – LOAD INPUT TERMINAL (C) | Rw2 = 30.0 / Iw2 = 10.0 |
| BETWEEN WIRING CONNECTION POINT (B) – WIRING CONNECTION POINT (D) | Rw3 = 20.0 / Iw3 = 6.0 |
| BETWEEN WIRING CONNECTION POINT (D) – LOAD INPUT TERMINAL (E) | Rw4 = 30.0 / Iw4 = 10.0 |
| BETWEEN WIRING CONNECTION POINT (D) – WIRING CONNECTION POINT (F) | Rw5 = 40.0 / Iw5 = 15.0 |
| BETWEEN WIRING CONNECTION POINT (F) – LOAD INPUT TERMINAL (G) | Rw6 = 30.0 / Iw6 = 10.0 |
| BETWEEN WIRING CONNECTION POINT (F) – LOAD INPUT TERMINAL (H) | Rw7 = 40.0 / Iw7 = 15.0 |

FIG.5

| RECORD NO <RECORD> | DRIVE ABILITY (KΩ) | | TOTAL WIRING RESISTANCE VALUE (Ω) | | CURRENT DENSITY LIMIT VALUE(A/$mm^2$) <Jlimit> |
|---|---|---|---|---|---|
| | MINIMUM VALUE <RESOURCE MIN> | MAXIMUM VALUE <RESOURCE MAX> | MINIMUM VALUE <RESIST MIN> | MAXIMUM VALUE <RESIST MAX> | |
| ⋮ | ⋮ | ⋮ | ⋮ | ⋮ | ⋮ |
| 7 | 0.03 | 0.06 | 150.0 | 200.0 | 200.0 |
| 8 | 0.06 | 0.09 | 0.0 | 50.0 | 30.0 |
| 9 | 0.06 | 0.09 | 50.0 | 100.0 | 60.0 |
| 10 | 0.06 | 0.09 | 100.0 | 150.0 | 100.0 |
| 11 | 0.06 | 0.09 | 150.0 | 200.0 | 200.0 |
| 12 | 0.09 | 1.20 | 0.0 | 50.0 | 40.0 |
| ⋮ | ⋮ | ⋮ | ⋮ | ⋮ | ⋮ |

METHOD AND APPARATUS FOR REVISING WIRING OF A CIRCUIT TO PREVENT ELECTRO-MIGRATION

BACKGROUND OF THE INVENTION

1. Field of the Invention

The present invention relates to a wiring designing method and a wiring designing apparatus for electrically and mutually connecting a plurality of functional blocks of a semiconductor integrated circuit.

2. Description of the Prior Art

Integration and speed of large scaled integrated circuits (LSI) are remarkably increasing year by year. Correspondingly, the power consumptions of the circuits are increasing. Thus, the probability that a wire with a large current density melts due to electro-migration becomes high.

The electro-migration is a phenomenon that takes place in such a manner that when a current density increases in a wiring metal film or the power consumption per chip increases, the temperature of the device rises. When a high density current flows in such a high temperature situation, metal ions of the metal film migrate because of carriers. As a result, holes take place. Consequently, the current density further increases. Thus, a wire melts.

To prevent the electro-migration from taking place, the width of the wire may be increased. Alternatively, the length of the wire may be shortened by inserting an extension buffer or the like in the wiring. For example, JPA 11-97541 discloses an invention that relates to a method for designing a wiring of a semiconductor integrated circuit. The related art reference discloses a technology in which a current density of a current that flows in a wiring between functional blocks is obtained. Depending on whether the current density is less than a predetermined value, the number of wires for each branch is calculated. Then re-wiring is performed for each branch.

However, to prevent such a problem, for a net having a probability that a wire may melt due to the electro-migration, the wired result may be manually corrected. In such a case, the number of steps for correcting the wiring will increase.

Moreover, in the related art reference disclosed as JPA. 11-97541, when the current density of a current that flows in a wiring is not less than the predetermined value, the number of wires necessary for each branch is calculated. Corresponding to the calculated result, the wiring is performed once again. Thus, there is a situation that the initial wiring is not used at all. In addition, when the new wiring occupies a large area on a wiring board or a substrate, many restrictions will take place for the wiring.

SUMMARY OF THE INVENTION

The present invention was made from the above-described point of view. An object of the present invention is to provide a wiring designing method and a wiring designing apparatus that prevent wires from melting due to the influence of the electro-migration caused by an excessive current density in a semiconductor integrated circuit.

Another object of the present invention is to provide a wiring designing method and a wiring designing apparatus that allow a part of a wire that tends to melt or that has a probability to melt in a semiconductor integrated circuit to be effectively and quickly detected and corrected.

According to the present invention, there is provided a method for revising wiring of a circuit to prevent electromigration, comprising the steps of: calculating a current density at a branch of a net; determining whether or not the current density exceeds a limit value; revising a wiring which affects the current density in order to reduce the current density if the current density exceeds the limit value.

In the method, the limit value may be determined to prevent the electro-migration.

In the method, the limit value may depend on drive ability of a device which drives the net.

In the method, the limit value may depend on resistance of an interval of the net, the interval ending at the branch.

In the method, the revising the wiring may be reducing resistance of an interval of the net, the interval ending at the branch.

In the method, the reducing the resistance of the interval may be widening the interval.

The method may further comprise a step of tracing the net to obtain the branch.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 4 is a table showing the relation between wiring portion and wiring resistance/current value;

FIG. 5 is a schematic diagram showing an example of the definition of a current density limit value according to the embodiment of the present invention.

DESCRIPTION OF PREFERRED EMBODIMENT

Figure 1:
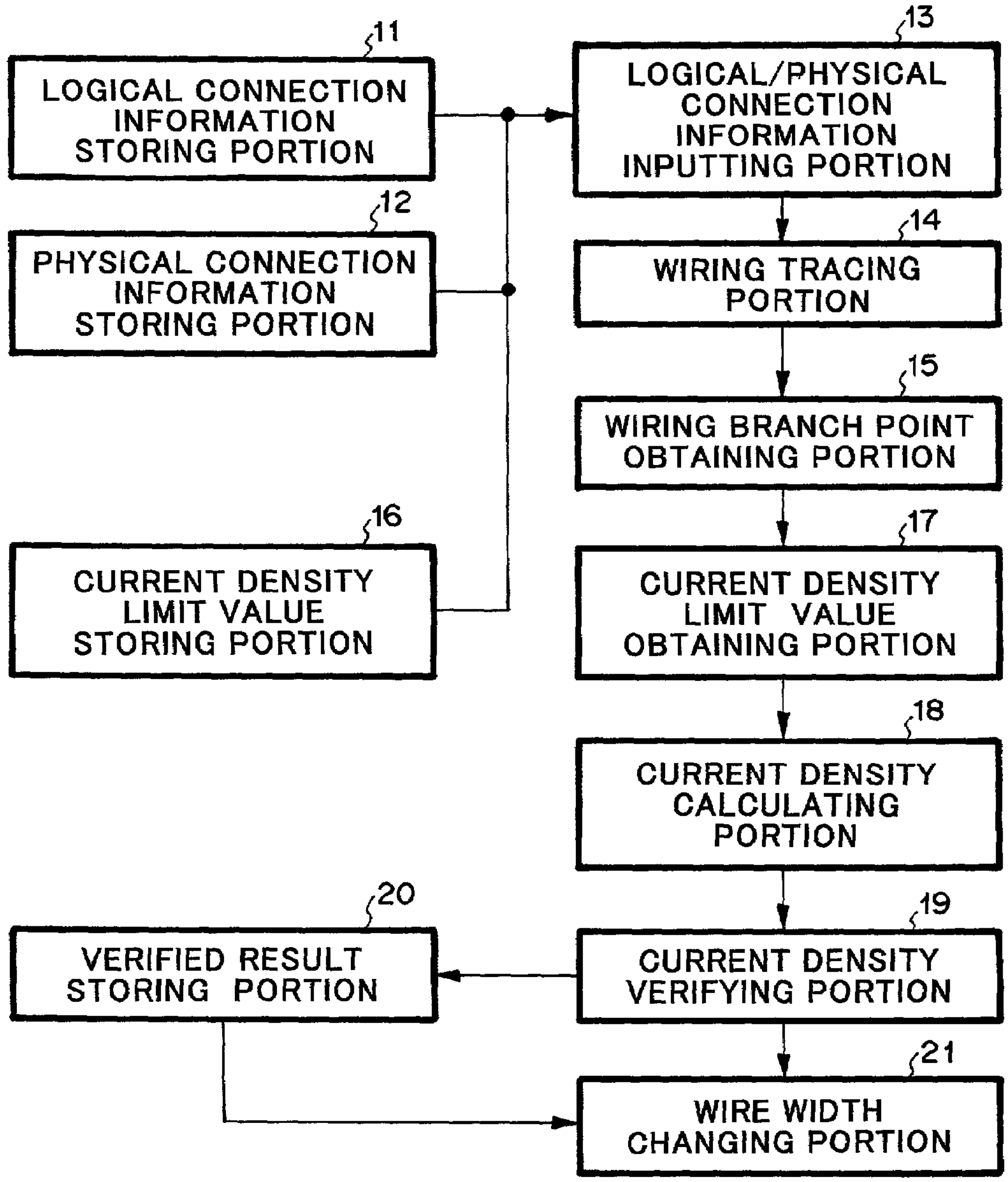
FIG. 1 is a block diagram showing the overall structure of a wiring designing apparatus according to an embodiment of the present invention.

Next, with reference to the accompanying drawings, an embodiment of the present invention will be described. FIG. 1 is a block diagram showing the overall structure of a wiring designing apparatus according to the embodiment of the present invention. Referring to FIG. 1, the wiring designing apparatus comprises a logical connection information storing portion 11, a physical connection information storing portion 12, a current density limit value storing portion 16, a logical/physical connection information inputting portion 13, a wiring tracing portion 14, a wiring branch point obtaining portion 15, a current density limit value obtaining portion 17, a current density calculating portion 18, a current density verifying portion 19, a verified result storing portion 20, and a wire width changing portion 21.

Among these structural portions, the logical connection information storing portion 11 stores logical connection information and so forth among blocks that compose the circuit. In this case, "block" is a general term that represents all elements such as a flip flop (F/F) and a gate that compose a logic circuit. The physical connection information storing portion 12 stores physical connection information comprising block position information, inter-block wiring information, and information that represents characteristics of each net/block.

The current density limit value storing portion 16 stores current density limit value information comprising current density limit values defined for each combination of the drive ability of each source (signal source or current source) and the total wiring resistance between each source output terminal and each wiring branch point.

The logical/physical connection information inputting portion 13 inputs logical connection information stored in the logical connection information storing portion 11, physical connection information stored in the physical connection information storing portion 12, and current density limit value information stored in the current density limit value storing portion 16.

The wiring tracing portion 14 references the logical connection information and the physical connection information that are input from the logical/physical connection information inputting portion 13 and traces wiring connection information of the net. The wiring branch point obtaining portion 15 references the wiring connection information obtained by the wiring tracing portion 14 and obtains wiring branch points of the net.

The current density limit value obtaining portion 17 references the current density limit value information that is input from the current density limit value storing portion 16 through the logical/physical connection information inputting portion 13 and obtains a current density limit value of each wiring branch point obtained by the wiring branch point obtaining portion 15.

The current density calculating portion 18 calculates a current density value of each wiring branch point obtained by the wiring branch point obtaining portion 15. The current density verifying portion 19 verifies the current density value of each wiring branch point obtained by the wiring branch point obtaining portion 15. The current density verifying portion 19 also compares an appropriate one of the current density limit values obtained by the current density limit value obtaining portion 17 with each current density value calculated by the current density calculating portion 18. If a certain current density value exceeds the corresponding current density limit value, the current density verifying portion 19 determines that an excessive current density error takes place at a relevant wiring branch point and sends error information to the verified result storing portion 20.

The verified result storing portion 20 stores the excessive current density error information issued by the current density verifying portion 19. The wire width changing portion 21 references the error information stored in the verified result storing portion 20 and widens the width of a wire that connects a relevant source output terminal and the wiring branch point in which the excessive current density error takes place so that no error takes place.

Next, the operation of each portion of the apparatus shown in FIG. 1 will be further described in more detail. The logical/physical connection information inputting portion 13 inputs the logical connection information stored in the logical connection information storing portion 11, the physical connection information stored in the physical connection information storing portion 12, information that represents characteristics of each net/block (including information necessary for calculating a current density), and the current density limit values stored in the current density limit value storing portion 16.

The wiring tracing portion 14 references the logical connection information and the physical connection information that are input from the logical/physical connection information inputting portion 13 and obtains the wiring connection information on source side blocks of the net, load side blocks of the net, and wires that connect these blocks.

Next, the wiring branch point obtaining portion 15 references the wiring connection information traced by the wiring tracing portion 14 and obtains wiring branch points of the net. The current density limit value obtaining portion 17 obtains a current density limit value of each wiring branch point obtained by the wiring branch point obtaining portion 15 from current density limit values that are input from the logical/physical connection information inputting portion 13.

The current density calculating portion 18 calculates a current density value at each wiring branch point obtained by the wiring branch point obtaining portion 15. In this case, the relation of connections of wires are checked from the source side to the load side. Current density values of wiring branch points are calculated, starting from the wiring branch point closest to the source side.

The current density verifying portion 19 verifies a current density at each wiring branch point obtained by the wiring branch point obtaining portion 15. In other words, the current density verifying portion 19 compares a current density limit value obtained by the current density limit value obtaining portion 17 with a current density value calculated by the current density calculating portion 18. If the current density value exceeds the current density limit value, the current density verifying portion 19 determines that an excessive current density error takes place at the relevant wiring branch point and outputs error information to the verified result storing portion 20.

After current densities at all the wiring branch points of the net have been verified, if there is a wiring branch point at which an excessive current density error takes place, the wire width changing portion 21 references error information stored in the verified result storing portion 20 and widens the width of the wire that connects the source output terminal and the wiring branch point at which the excessive current density error takes place so that no error takes place.

If the width of a wire is varied, a current density thereof is also varied. Thus, for the net, the current density calculating portion 18 calculates a current density at the wiring branch point again. The current density verifying portion 19 verifies the current density at the wiring branch point again. The wire width changing portion 21 changes the width of the wire at the wiring branch point at which the excessive current density error takes place, if any. In this example, such processes are repeated until all the wiring branch points at each of which an excessive current density error takes place disappear.

Next, the operation of the wiring designing apparatus according to the embodiment will be described in detail.

As was described above, generally, the larger a current density of the wire is, the larger the probability that a wire melts due to the electro-migration is. The current density in a wire can is obtained by dividing the current value of a current that flows in the wire by the sectional area thereof.

If a wire branches partway, a current that flows in the wire also branches. Therefore, as the current from a source output terminal passes the branch point, the current that flows in the wire decreases. Thus, a current density varies at a point where a wiring branches or the sectional area of the wire varies.

Assuming that the width of a wire of a net varies at only a wiring branch point, a current density varies at only a wiring branch point.

In the wiring designing apparatus according to the embodiment of the present invention, a current density value at a wiring branch point serving as a change point of a current density is compared with the maximum current density value (current density limit value) that is a predetermined value and within which a wire does not melt due to the influence of the electro-migration, so as to determine whether or not an excessive current density error takes place.

Since the probability that a wire melts due to the electromigration is large at a wiring branch point at which an excessive current density error takes place, the current density is decreased by widening the width of the wire that connects the source output terminal and the wiring branch point. As a result, the wire can be prevented from melting.

Figure 2:
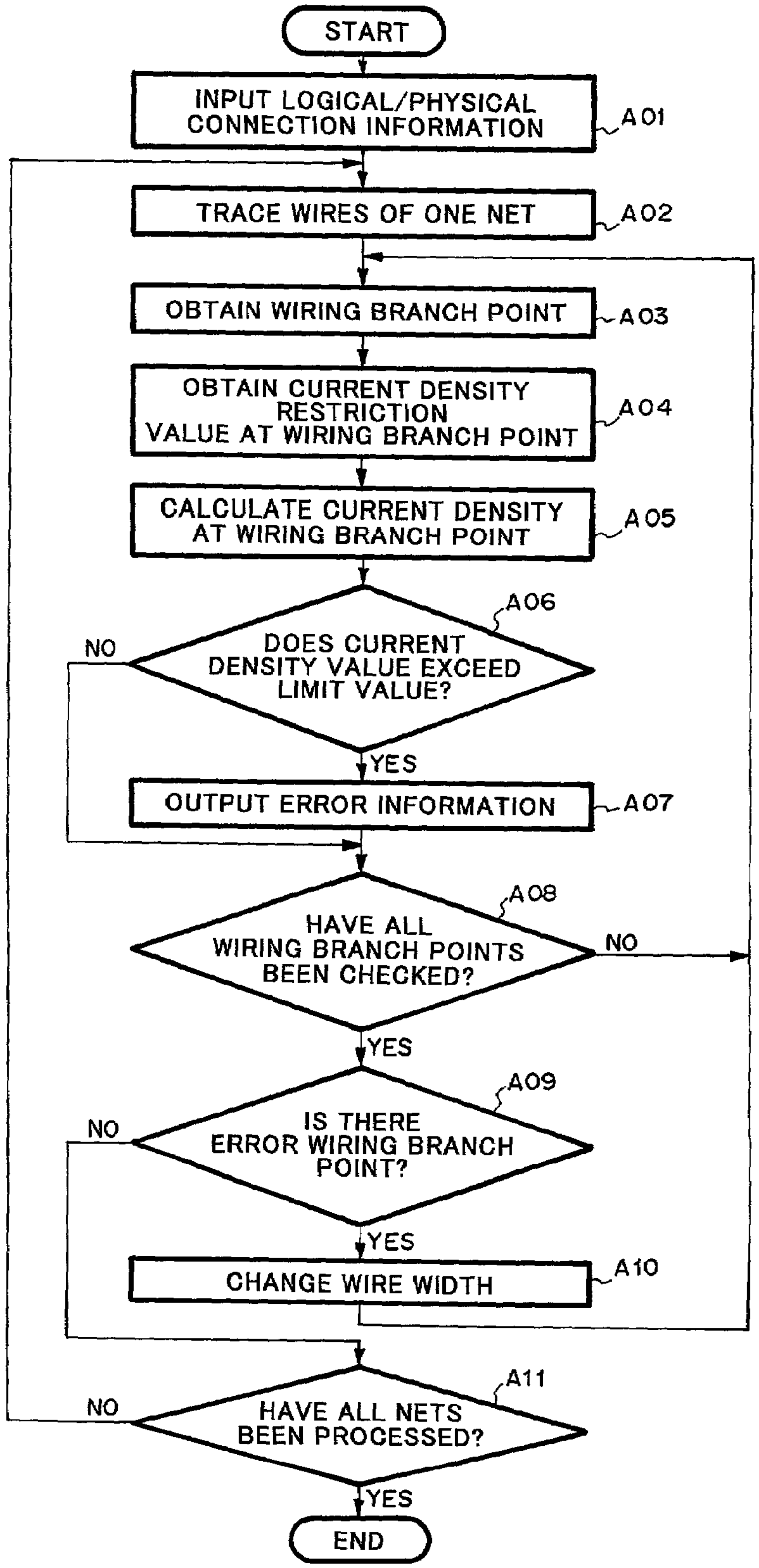
FIG. 2 is a flow chart showing a process for determining an excessive current density error and changing a wire width according to the embodiment of the present invention.
Figure 3:
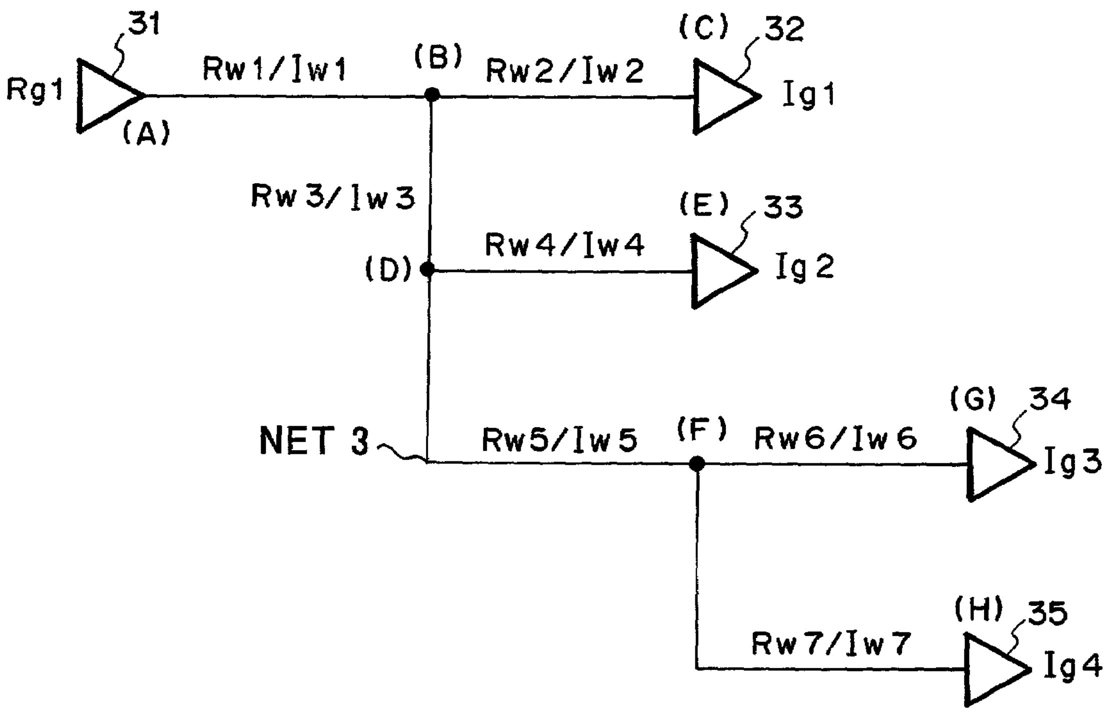
FIG. 3 is a schematic diagram showing an example of a net for which the process for determining an error and changing a wire width is performed.

FIG. 2 is a flow chart showing a process for determining whether or not an excessive current density error takes place and for changing the width of a wire, executed in the wiring designing apparatus according to the embodiment of the present invention. FIG. 3 shows an example of a net for which the process for determining whether or not an excessive current density error takes place and for changing the width of a wire is performed. In FIG. 2, at step A01, the logical/physical connection information inputting portion 13 inputs the logical connection information stored in the logical connection information storing portion 11, the physical connection information stored in the physical connection information storing portion 12, and the current density limit values stored in the current density limit value storing portion 16. The input logical connection information and physical connection information are referenced by each portion of the wiring designing apparatus as shown in FIG. 1.

Logical connection information includes logical connection information among blocks that compose a relevant circuit. Physical connection information includes block position information, inter-block wiring information, information that represents characteristics of each net/block, and so forth.

It is assumed that the block position information and the inter-block wiring information are results of a disposing and wiring process using a conventional layout method which does not take a current density of each wire into consideration. In addition, it is assumed that information that represents the characteristics of each net/block includes width/height of each wire of the net, resistance value/capacitance value per unit area of each wire, resistance value/capacitance value of each terminal of each block, and so forth.

Next, at step A02, a current density at each wiring branch point of any net of the circuit is verified. In this example, net 3 as shown in FIG. 3 is verified. First of all, the wiring tracing portion 14 references the logical connection information and the physical connection information that are input from the logical/physical connection information inputting portion 13. The wiring tracing portion 14 obtains the wiring connection information that represents that the net 3 is composed of wires that connect a source side block 31 and load side blocks 32 to 35 and there are a source output terminal (A), wiring branch points (B), (D), (F), and load input terminals (C), (E), (G), and (H).

Wiring resistance values and wiring current values of the net 3 as shown in FIG. 3 are as follows:

Terminal resistance Rg1 of source output terminal (A)=0.07 kΩ

The relation between wiring portion and wiring resistance/current value is as shown in FIG. 4.

In addition,

Current value Ig1 of wire of load input terminal (C)=1.0 A

Current value Ig2 of wire of load input terminal (E)=1.0 A

Current value Ig3 of wire of load input terminal (G)=1.0 A

Current value Ig4 of wire of load input terminal (H)=1.0 A

The wiring tracing portion 14 references these wiring connection information, checks the connections of wires from the source side to the load side, and verifies a current density at each wiring branch point, starting from the wiring branch point closest to the source side. In this example, the load input terminal is treated as a wiring branch point that is included as an object for a current density to be verified.

For example, in the net 3 as shown in FIG. 3, enumerating wiring branch points in the order of the distance from the source side, there are wiring branch point (B)→wiring branch point (D)→load input terminal (C)→load input terminal (E)→wiring branch point (F)→load input terminal (G)→load input terminal (H). In this example, the explanation will be made on the assumption that an excessive current density error takes place in the wiring branch point (B).

Next, at step A03, the wiring branch point obtaining portion 15 checks a wiring branch point that has not been processed and that is the closest to the source side, obtains the wiring branch point (B), and calculates the total wiring resistance value Rtotal (B) at the wiring branch point (B). In this example, the total wiring resistance value is the sum of resistance values of wires that connect the source output terminal and the wiring branch point with one stroke.

For example, since the table of FIG. 4 shows that the resistance value Rw1 of a wire that connects the source output terminal (A) and the wiring branch point (B) is 30.0Ω, the total wiring resistance value Rtotal (B) becomes 30.0Ω.

Next, at step A04, the current density limit value obtaining portion 17 obtains the current density limit value Jlimit (B) at the wiring branch point (B). The current density limit value is the maximum current density value that is obtained from the execution result of a circuit simulation and within which a wire does not melt. The current density limit value is defined for each combination of the drive ability of each source output terminal and the total wiring resistance value. The drive ability of each source output terminal is designated with a terminal resistor.

FIG. 5 shows an example of the definition of current density limit values in the wiring designing apparatus according to the embodiment of the present invention. In FIG. 5, one line represents one record. Each record is assigned a unique record number n. A current density limit value Jlimit (n) of a record that satisfies both current density limit value selection conditions (a) and (b) as shown below is selected as the current density limit value at a relevant wiring branch point.

Condition (a): minimum drive ability value Resource_MIN (n)≦drive ability of source output terminal<maximum drive ability value Resource_MAX (n)

Condition (b): minimum total wiring resistance value Resist_MIN (n)≦total wiring resistance value at wiring branch point<maximum wiring resistance value Resist_MAX (n).

As was described above, since the terminal resistance Rg1 of the source output terminal (A) is 0.07 kΩ and the total wiring resistance value Rtotal (B) is 30.0Ω, in FIG. 5, the record number that satisfies both the conditions (a) and (b) is "8". Thus, in this case, 30.0 A/mm$^2$ that is the current density limit value of the record number 8 is treated as the current density limit value Jlimit (B) at the wiring branch point (B).

Next, at step A05, the current density calculating portion 18 calculates the current density value Jtotal (B) at the wiring branch point (B). In FIG. 3, the current value of the current that flows at the wiring branch point (B) is the sum of the current values of the currents that flow in the wires that connect the wiring branch point (B) and the load input terminals (C), (E), (G), and (H). Thus, the result of dividing the sum of the current values of the wires in the region by the sectional area at the wiring branch point (B) becomes the current density value Jtotal (B) at the wiring branch point (B).

Since the current values of the wires at the branch points of the net 3 shown in FIG. 3 are Iw1 to Iw7 and the current density values of the wires of the load side blocks are Ig1 to Ig4, the total current value of the region becomes the sum of Iw2 to Iw7 and Ig1 to Ig4, namely, 70.0 A. Thus, assuming that the sectional area at the wiring branch point (B) is 1 mm$^2$, the current density value Jtotal (B) becomes 70.0 A/mm$^2$. These processes are executed at step A05 shown in FIG. 2.

At step A06, the current density at the wiring branch point (B) is verified. In other words, the current density verifying portion 19 compares the current density limit value Jlimit (B) obtained by the current density limit value obtaining portion 17 with the current density value Jtotal (B) calculated by the current density calculating portion 18.

As was described above, since the current density limit value Jlimit (B) at the wiring branch point (B) is 30.0 A/mm$^2$ and the current density value Jtotal (B) is 70.0 A/mm$^2$, the current density value Jtotal (B) exceeds the current density limit value Jlimit (B). As a result, the current density verifying portion 19 determines that an excessive current density error takes place at the wiring branch point (B) and outputs error information to the verified result storing portion 20 (at step A07 shown in FIG. 2).

In this example, as the error information, the net name, the coordinates of the wiring branch point (B), the terminal resistance Rg1, the total wiring resistance value Rtotal (B), the current density value Jtotal (B), the current density limit value Jlimit (B), and so forth are output. After the error information is output, at step A08, it is determined whether or not all the wiring branch points have been checked.

In other words, after the process for the wiring branch point (B) has been completed, if there is at least a wiring branch point not having been processed, the determined result at step A08 is "no". Thus, the flow returns to step A03. At step A03, the next wiring branch point is processed.

When the process for the wiring branch point (B) has been completed, the wiring branch point obtaining portion 15 checks a wiring branch point that has not been processed and that is the closest to the source side. As a result, the wiring branch point (D) is obtained. The total wiring resistance value Rtotal (D) at the wiring branch point (D) is calculated (at step A03).

As is apparent from FIG. 3, the total wiring resistance value Rtotal (D) is 50.0Ω that is the sum of the resistance value Rw1 (30.0Ω) of the wire that connects the source output terminal (A) and the wiring branch point (B) and the resistance value Rw3 (20.0Ω) of the wire that connects the wiring branch point (B) and the wiring branch point (D).

Next, at step A04, the current density limit value obtaining portion 17 obtains the current density limit value Jlimit (D) at the wiring branch point (D) from the defined current density limit values that are input from the logical/physical connection information inputting portion 13.

The terminal resistance Rg1 at the source output terminal (A) of the wiring branch point (D) is 0.07 kΩ. As was described above, the total wiring resistance value Rtotal (D) is 50.0Ω. Thus, as shown in FIG. 5, the record number that satisfies both the current density limit value selection conditions (a) and (b) becomes "9". As a result, since the current density limit value of the record number 9 is 60.0 A/mm$^2$, the current density limit value Jlimit (D) at the wiring branch point (D) becomes 60.0 A/mm$^2$.

Next, at step A05, the current density calculating portion 18 calculates the current density value Jtotal (D) at the wiring branch point (D). The current value that flows at the wiring branch point (D) is the sum of current values of currents that flow in wires that connect the wiring branch point (D) and the load input terminals (E), (G), and (H). The result of dividing the sum of the current values of the currents that flow in the wires in the region by the sectional area of the wiring branch point (D) becomes the current density value Jtotal (D) at the wiring branch point (D).

Specifically, the current value in the above-described region becomes 53.0 A that is the total value of Iw4 to Iw7 and Ig2 to Ig4. Assuming that the sectional area of the wiring branch point (D) is 1 mm$^2$, the current density value Jtotal (D) becomes 53.0 A/mm$^2$.

Next, at step A06, the current density verifying portion 19 verifies the current density at the wiring branch point (D). That is, the current density verifying portion 19 compares the current density limit value Jlimit (D) obtained by the current density limit value obtaining portion 17 with the current density value Jtotal (D) calculated by the current density calculating portion 18.

As a result, since the current density limit value Jlimit (D) is 60.0 A/mm$^2$ and the current density value Jtotal (D) is 53.0 A/mm$^2$, it is apparent that the current density value Jtotal (D) does not exceed the current density limit value Jlimit (D) (namely, the determined result at step A06 is "no").

Thus, the current density verifying portion 19 determines that no excessive current density error takes place at the wiring branch point (D). At step A08, it is determined whether or not all the wiring branch points have been checked. Depending on the determined result at step A08, the next wiring branch point is processed.

Unless all the wiring branch points have been checked, like the above-described wiring branch points (B) and (D), the current densities of the load input terminal (C), the load input terminal (E), the wiring branch point (F), the load input terminal (G), and the load input terminal (H) are verified in succession. As was described above, it is assumed that no excessive current density error takes place at wiring branch points other than the wiring branch point (B).

After the current densities at the individual wiring branch points have been verified, the wire width changing portion 21 changes the width of the wire in the interval in which an excessive current density error takes place. However, when there is no wiring branch point at which an excessive current density error takes place, the process for the net is completed. Thereafter, the process for the next net is performed.

When there is a wiring branch point at which an excessive current density error takes place, the determined result at step A09 is "yes". Therefore, the wire width changing portion 21 references error information stored in the verified result storing portion 20 and widens the width of a wire that connects the source output terminal and a wiring branch point at which such an error takes place so that the error does not take place (at step A10).

Since an excessive current density error takes place at the wiring branch point (B) in the net 3 shown in FIG. 3, the wire width changing portion 21 widens the width of a wire that connects the source output terminal (A) and the wiring branch point (B). Because the width of the wire is changed, the current density is also varied. Thus, after the width of the wire is changed, the current densities at the individual wiring branch points in the net 3 are verified again so as to determine whether or not a current density restriction error takes place with the changed wire width.

The above-described process and verification are repeated until wiring branch points at which a current density restriction error takes place disappear. As a result, when wiring branch points at which a current density restriction error takes place disappear, the process for the present net is completed. Thereafter, the process for the next net is performed (namely, the determined result at step A11 is "no").

The above-described process is repeated for all the nets of the circuit. When the determined result at step A11 becomes "yes", the process for all the nets has been completed. In this way, the error determining and the wire width changing process is completed.

Figure 6:
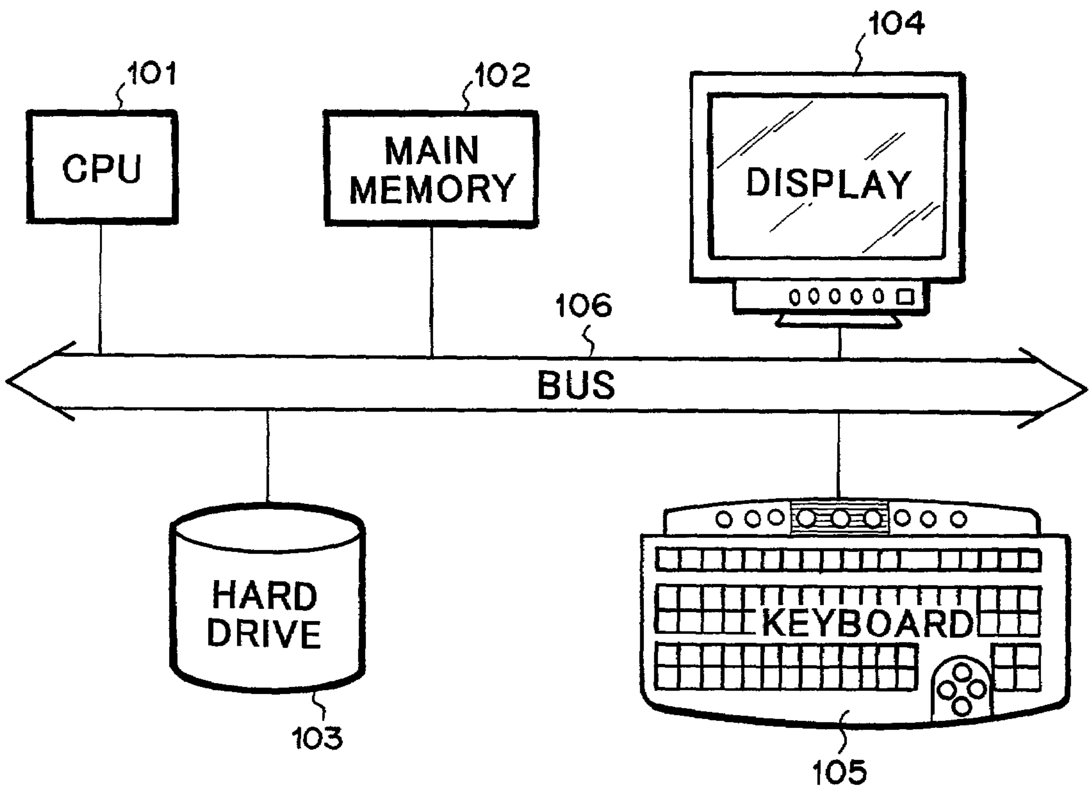
FIG. 6 is a schematic diagram showing a computer for realizing the wiring designing apparatus according to the embodiment of the present invention.

The wiring designing apparatus may be realized using a computer as shown in FIG. 6. The computer comprises a CPU 101, a main memory 102, a hard drive 103, a display 104, keyboard 105, and a bus 106. The hard drive 103 stores a program for having the computer function as the a logical/physical connection information inputting portion 13, a wiring tracing portion 14, a wiring branch point obtaining portion 15, a current density limit value obtaining portion 17, a current density calculating portion 18, a current density verifying portion 19, a verified result storing portion 20, and a wire width changing portion 21. The hard drive 103 also has the logical connection information storing portion 11, the physical connection information storing portion 12, and the current density limit value storing portion 16. The program is read from the hard drive 103 and temporarily stored in the main memory 102. Thereafter, each instruction of the program is fetched by the CPU 101 from the main memory 102 and executed by the CPU 101.

As was described above, according to the embodiment of the present invention, a current density value at each wiring branch point of each net of a semiconductor integrated circuit is calculated. By comparing the obtained current density value with a current density limit value, an occurrence of electro-migration is verified. Only a wire of a portion in which an excessive current density error takes place is optimally widened so as to decrease the current density. As a result, a wire can be prevented from melting because electro-migration is avoided in advance. In addition, it is not necessary to perform a re-wiring work.

In other words, when a large scaled integrated circuit (LSI) is designed, since the influence of electro-migration due to an excessive current density is considered, a wire can be prevented from melting.

In addition, due to the fact that the probability that a melting of a wire takes at a wiring branch point is high, the relation of connections of wires is checked from the source side to the load side. Current densities of wiring branch points are verified starting from a wiring branch point closest to the source side. A current density of a wire that connects a source output terminal and a wiring branch point at which an excessive current density error takes place is decreased. As a result, a wire is prevented from melting. Thus, a wiring branch point at which an excessive current density error takes place can be effectively detected.

According to the embodiment of the present invention, all the nets of the circuit are verified. However, the present invention is not limited to such an example. For example, only limited nets may be verified. Alternatively, all the nets except for limited nets may be verified.

Although the present invention has been shown and described with respect to the best mode embodiment thereof, it should be understood by those skilled in the art that the foregoing and various other changes, omissions, and additions in the form and detail thereof may be made therein without departing from the spirit and scope of the present invention.

What is claimed is:

1. A method for revising wiring of a circuit to prevent electro-migration, said method comprising:

for each net in said circuit, identifying each branch point in said net;

calculating a current density at each said branch point of said net;

determining whether or not said current density exceeds a limit value; and automatically revising a wiring which affects said current density in order to reduce said current density if said current density exceeds said limit value.

2. The method as set forth in claim 1, wherein said limit value is determined to prevent said electro-migration.

3. The method as set forth in claim 1, wherein said limit value depends on a drive ability of a device which drives said net.

4. The method as set forth in claim 1, wherein said limit value depends on a resistance of an interval of said net, said interval ending at said branch.

5. The method as set forth in claim 1, wherein the revising said wiring comprises reducing a resistance of an interval of said net, said interval ending at said branch.

6. The method as set forth in claim 5, wherein the reducing the resistance of said interval comprises widening a conductor in said interval.

7. The method as set forth in claim 1, further comprising: tracing said net to obtain said branch.

8. An apparatus for revising wiring of a circuit to prevent electro-migration, said apparatus comprising:

means for identifying, in each net of said circuit, all branch points in said net and calculating a current density at each said branch point of said net;

means for determining whether or not said current density exceeds a limit value; and means for automatically revising a wiring which affects said current density in order to reduce said current density if said current density exceeds said limit value.

9. The apparatus as set forth in claim 8, wherein said limit value is determined to prevent said electro-migration.

10. The apparatus as set forth in claim 8, wherein said limit value depends on a drive ability of a device which drives said net.

11. The apparatus as set forth in claim 8, wherein said limit value depends on a resistance of an interval of said net, said interval ending at said branch.

12. The apparatus as set forth in claim 8, wherein the means for revising said wiring comprises means for reducing a resistance of an interval of said net, said interval ending at said branch.

13. The apparatus as set forth in claim 12, wherein the means for reducing the resistance of said interval comprises means for widening a conductor in said interval.

14. The apparatus as set forth in claim 8, further comprising:

means for tracing said net to obtain said branch.

15. A computer program product embodied on a computer-readable medium and comprising codes that, when executed, cause a computer to:

for each net in said circuit, identify each branch point in said net;

calculate a current density at each said branch point of said net;

determine whether or not said current density exceeds a limit value; and automatically revise a wiring which affects said current density in order to reduce said current density if said current density exceeds said limit value.

16. The computer program product as set forth in claim 15, wherein said limit value is determined to prevent said electro-migration.

17. The computer program product as set forth in claim 15, wherein said limit value depends on a drive ability of a device which drives said net.

18. The computer program product as set forth in claim 15, wherein said limit value depends on a resistance of an interval of said net, said interval ending at said branch.

19. The computer program product as set forth in claim 15, wherein the revising said wiring comprises reducing a resistance of an interval of said net, said interval ending at said branch.

20. The computer program product as set forth in claim 19, wherein the reducing the resistance of said interval comprises widening a conductor in said interval.

21. The computer program product as set forth in claim 15, wherein said codes further cause the computer to perform a tracing of said net to obtain said branch.

* * * * *